(12) United States Patent
Jang et al.

(10) Patent No.: US 10,431,712 B2
(45) Date of Patent: Oct. 1, 2019

(54) INORGANIC EMITTING PARTICLE, INORGANIC EMITTING PARTICLE FILM, AND LED PACKAGE AND DISPLAY DEVICE INCLUDING THE SAME

(71) Applicant: LG DISPLAY CO., LTD., Seoul (KR)

(72) Inventors: Kyung-Kook Jang, Paju-si (KR); Byung-Geol Kim, Paju-si (KR); Dong-Young Kim, Haenam-Gun (KR); So-Mang Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/707,440

(22) Filed: Sep. 18, 2017

(65) Prior Publication Data
US 2018/0083158 A1    Mar. 22, 2018

(30) Foreign Application Priority Data

Sep. 19, 2016 (KR) .................... 10-2016-0119274

(51) Int. Cl.
*H01L 33/00* (2010.01)
*C09K 11/08* (2006.01)
(Continued)

(52) U.S. Cl.
CPC ........ *H01L 33/0045* (2013.01); *C01B 19/007* (2013.01); *C09C 3/06* (2013.01); *C09K 11/0805* (2013.01); *G02F 1/0045* (2013.01); *G02F 1/133603* (2013.01); *H01L 27/016* (2013.01); *H01L 33/502* (2013.01); *H01L 51/502* (2013.01); *C01B 13/00* (2013.01); *C01P 2002/84* (2013.01); *C01P 2002/85* (2013.01);
(Continued)

(58) Field of Classification Search
CPC ............................ G02F 1/0045; H01L 27/016
See application file for complete search history.

(56) References Cited

U.S. PATENT DOCUMENTS 6,710,366 B1 * 3/2004 Lee .................. B82Y 10/00
257/103
7,603,003 B2 * 10/2009 Bureatea ............ B82Y 20/00
385/5
(Continued)

OTHER PUBLICATIONS

Yang et al., "Full Visible Range Covering InP/ZnS Nanocrystals with High Photometric Performance and Their Application to White Quantum Dot Light-Emitting Diodes," Advanced Materials, 2012, 24, pp. 4180-4185.

*Primary Examiner* — Caridad Everhart
*Assistant Examiner* — Ankush K Singal
(74) *Attorney, Agent, or Firm* — Birch, Stewart, Kolasch & Birch, LLP

(57) ABSTRACT

An optical member for a multi-panel display device according to an embodiment includes a first optical member located on a first display device and including optical fibers, a second optical member located on a second display device neighboring the first display device and including optical fibers, and an optical fiber triangular bar located to overlap a region where the first and second optical members are adjacent to each other, and including optical fibers, wherein each of the first and second optical members includes a chamfer portion corresponding to the optical fiber triangular bar at the region where the first and second optical members are adjacent to each other.

23 Claims, 7 Drawing Sheets

(51) Int. Cl.
  *G02F 1/00* (2006.01)
  *G02F 1/1335* (2006.01)
  *H01L 27/01* (2006.01)
  *H01L 51/50* (2006.01)
  *H01L 33/50* (2010.01)
  *C01B 19/00* (2006.01)
  *C09C 3/06* (2006.01)
  *C01B 13/00* (2006.01)
  *C09K 19/00* (2006.01)

(52) U.S. Cl.
  CPC .. *C09K 19/00* (2013.01); *G02F 2001/133614* (2013.01); *G02F 2202/36* (2013.01)

(56) References Cited

U.S. PATENT DOCUMENTS

| | | | | |
|---|---|---|---|---|
| 7,888,700 B2* | 2/2011 | Kahen | ............... | H01L 33/18 257/103 |
| 8,962,378 B2* | 2/2015 | Euliss | ............... | H01L 31/0324 438/95 |
| 9,853,184 B2* | 12/2017 | Coe-Sullivan | ......... | B82Y 20/00 |
| 2006/0201390 A1* | 9/2006 | Lahann | ............... | B82Y 10/00 106/401 |
| 2008/0001538 A1* | 1/2008 | Cok | ............... | B82Y 20/00 313/506 |
| 2009/0114273 A1* | 5/2009 | Kamat | ............... | C09K 11/7492 136/252 |
| 2010/0006921 A1* | 1/2010 | Makihara | ............... | B82Y 10/00 257/321 |
| 2012/0064134 A1* | 3/2012 | Bourke, Jr. | ............. | A61Q 17/04 424/401 |
| 2013/0042906 A1* | 2/2013 | Lee | ............... | H01G 9/2031 136/255 |
| 2013/0158322 A1* | 6/2013 | Nyce | ............... | B01J 23/30 585/330 |
| 2013/0195979 A1* | 8/2013 | Tersigni | ............. | A61K 41/0052 424/490 |
| 2015/0185580 A1* | 7/2015 | Cho | ............... | G02F 1/153 359/266 |
| 2016/0161066 A1* | 6/2016 | Sung | ............... | H01L 33/502 362/84 |
| 2016/0161088 A1* | 6/2016 | Sung | ............... | H01L 33/502 362/97.1 |
| 2018/0117579 A1* | 5/2018 | Scher | ............... | B01J 21/066 |

* cited by examiner

INORGANIC EMITTING PARTICLE, INORGANIC EMITTING PARTICLE FILM, AND LED PACKAGE AND DISPLAY DEVICE INCLUDING THE SAME

CROSS REFERENCE TO RELATED APPLICATIONS

The present application claims the priority benefit of Korean Patent Application No. 10-2016-0119274 filed in Republic of Korea on Sep. 19, 2016, which is hereby incorporated by reference in its entirety for all purposes as if fully set forth herein into the present application.

BACKGROUND OF THE INVENTION

Field of the Invention

The present invention relates to a quantum dot, and more particularly, to an inorganic emitting particle having a high brightness with quantum dots attached to a metal oxide, an inorganic emitting particle film, and a light emitting diode (LED) package and a display device including the same.

Discussion of the Related Art

Facing information society, a display field of processing and displaying a large amount of electric information signals has been rapidly advanced, and accordingly, various flat display devices have been developed and used. As flat display devices, a liquid crystal display device (LCD), a plasma display panel device (PDP), a field emission display device (FED), an organic light emitting diode display device (OLED) and the like are used.

Recently, a research of applying a quantum dot to a display device has been carried out.

The quantum dot emits light while an electron in an unstable state jumps down from a conduction band into a valence band. Since the quantum dot has a great extinction coefficient and has an excellent quantum yield, it produces a strong fluorescent light. Further, since a light-emission wavelength changes according to a size of the quantum dot, a light of an entire visible light region can be obtained by adjusting the size of the quantum dot.

FIG. 1 is a schematic view illustrating a quantum dot according to the related art.

Referring to FIG. 1, the quantum dot 1 includes a core 10 and a shell 20. A material mostly used for the core is CdSe. The quantum dot 1 including the CdSe core 10 has an advantage of emitting a visible light having a high color purity.

However, when forming a film with a plurality of quantum dots 1, the quantum dot film is reduced in a quantum efficiency and/or a brightness.

SUMMARY OF THE INVENTION

Accordingly, the present invention is directed to an inorganic emitting particle, an inorganic emitting particle film, and an LED package and a display device including the same that substantially obviates one or more of the problems due to limitations and disadvantages of the related art.

An object of the present invention is to provide an inorganic emitting particle, an inorganic emitting particle film, and an LED package and a display device including the same that can improve a reduction of a quantum efficiency and/or a brightness produced in a quantum dot film.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an inorganic emitting particle includes an inorganic oxide having a first size, and quantum dots attached to the inorganic oxide and having a second size less than the first size.

In another aspect, an inorganic emitting particle film includes the above-described inorganic emitting particles.

In another aspect, a liquid crystal display device includes a liquid crystal panel, a backlight unit below the liquid crystal panel and including a light source, and the above-described inorganic emitting particle film and between the liquid crystal panel and the backlight unit.

In another aspect, an LED package includes an LED chip, and an encapsulation part including the above-described inorganic emitting particles and covering the LED chip.

In another aspect, a liquid crystal display device includes a backlight unit including the above-described LED package, and a liquid crystal panel on the backlight unit.

In another aspect, a light emitting diode display device includes a substrate; a light emitting diode that includes first and second electrodes facing each other, and an emitting layer including the above-described inorganic emitting particles and located between the first and second electrodes; and a driving element between the substrate and the light emitting diode and connected to the light emitting diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
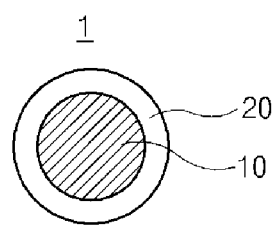
FIG. 1 is a schematic view illustrating a quantum dot according to the related art.

Since each quantum dot has a high quantum efficiency, a light from the quantum dot has a high brightness.

However, when forming a thin film with a plurality of quantum dots, a distance between particles is reduced, and accordingly, because of a forster resonance energy transfer (FRET) phenomenon, a quantum efficiency of the thin film is reduced. Further, since the quantum dot has a size less than a wavelength of a light source, the quantum dot may not sufficiently absorb a light of the light source. Thus, a brightness of the quantum dot film is reduced.

To solve or reduce the above problems and limitations associated with the related art, one or more embodiments of the present invention provide an inorganic emitting particle that includes an inorganic oxide having a first size, and a quantum dot attached to the inorganic oxide and having a second size less than the first size.

In the inorganic emitting particle of the present invention in one example, the inorganic oxide has a energy band gap greater than the quantum dot.

In the inorganic emitting particle of the present invention, the inorganic oxide can be a metal oxide or silicon oxide.

In the inorganic emitting particle of the present invention, the inorganic oxide can be one of $ZrO_2$, $TiO_2$, $Fe_2O_3$, NiO, $MnO_2$, $Al_2O_3$, $CeO_2$, and $SiO_2$.

In another aspect, the present invention provides an inorganic emitting particle film that can include the above-described inorganic emitting particle.

The inorganic emitting particle film of the present invention can further include a nano rod absorbing a light of a wavelength of 430 nm~470 nm.

In the inorganic emitting particle film of the present invention, the nano rod can have an energy band gap that is less than the inorganic oxide and greater than the quantum dot.

In the inorganic emitting particle film of the present invention, the nano rod can have a weight % of 5~30 with respect to the inorganic emitting particle.

In yet another aspect, the present invention can include a liquid crystal panel, a backlight unit located below the liquid crystal panel and including a light source, and the above-described inorganic emitting particle film located between the liquid crystal panel and the backlight unit.

In yet another aspect, the present invention can include an LED (light emitting diode) package that includes an LED chip, and an encapsulating portion covering the LED chip and including the above-described inorganic emitting particle.

In the LED package of the present invention, the encapsulation part further can include a nano rod absorbing a light of a wavelength of 430 nm~470 nm.

In the LED package of the present invention, the nano rod can have an energy band gap that is less than the inorganic oxide and greater than the quantum dot.

In yet another aspect, the present invention can include a liquid crystal display device that includes a backlight unit including the above-described LED package, and a liquid crystal panel located on the backlight unit.

In the liquid crystal display device of the present invention, the encapsulation part further can include a nano rod absorbing a light of a wavelength of 430 nm~470 nm.

In the liquid crystal display device of the present invention, the nano rod can have an energy band gap that is less than the inorganic oxide and greater than the quantum dot.

In yet another aspect, the present invention can include a light emitting diode display device that includes a substrate, a light emitting diode (LED) which includes first and second electrodes located on the substrate and facing each other, and an emitting layer including the above-described inorganic emitting particle and located between the first and second electrodes, and a driving element located between the substrate and the LED and connected to the LED.

In the light emitting diode display device of the present invention, the emitting layer further can include a nano rod absorbing a light of a wavelength of 430 nm~470 nm.

In the light emitting diode display device of the present invention, the nano rod can have an energy band gap that is less than the inorganic oxide and greater than the quantum dot.

Reference will now be made in detail to exemplary embodiments, examples of which are illustrated in the accompanying drawings. The same reference numbers may be used throughout the drawings to refer to the same or like parts.

Figure 2:
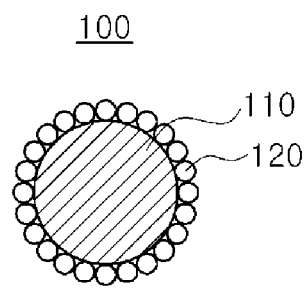
FIG. 2 is a schematic view illustrating an inorganic emitting particle according to a first embodiment of the present invention.

FIG. 2 is a schematic view illustrating an inorganic emitting particle according to a first embodiment of the present invention.

Referring to FIG. 2, an inorganic emitting particle 100 of this embodiment includes an inorganic oxide 110 and quantum dots 120 attached on a surface of the inorganic oxide 110. In other words, the plurality of quantum dots 120 combined on the surface of the inorganic oxide 110 forms the inorganic emitting particle 100.

The inorganic oxide 110 has a size (or diameter) greater than that of the quantum dot 120. For example, the size of the inorganic oxide 110 may be 100 nm~300 nm.

The inorganic oxide 110 may be a metal oxide or silicon oxide. For example, the inorganic oxide 110 may be one of $ZrO_2$, $TiO_2$, $Fe_2O_3$, NiO, $MnO_2$, $Al_2O_3$, $CeO_2$, and $SiO_2$.

Each quantum dot 120 includes a core and a shell enclosing the core.

Each of the core and the shell may be made of a semiconductor compound. For example, each of the core and the shell may be made of a II-V group compound or III-V compound.

The core and the shell are made of different ones, respectively, out of CdSe, CdS, CdTe, ZnO, ZnSe, ZnS, ZnTe, HgSe, HgTe, CdZnSe, InP, InN, GaN, InSb, InAsP, InGaAs, GaAs, GaP, GaSb, AlP, AlN, AlAs, AlSb, CdSeTe, and ZnCdSe.

Each quantum dot 120 has a size less than that of the inorganic oxide 110, and has an energy band gap less than that of the inorganic oxide 110. In a case that the inorganic oxide 110 has an energy band gap less than that of the quantum dot 120, an energy of the quantum dot 120 is transferred to the inorganic oxide 110 and thus an quantum efficiency of the quantum dot 120 is reduced. In other words, since the inorganic oxide 110 does not play a light emission role, in order to prevent a transfer of the energy of the quantum dot 120 to the inorganic oxide 110, the inorganic oxide 110 preferably has an energy band gap greater than that of the quantum dot 120.

When a light is radiated to the inorganic emitting particle 100, the quantum dot 120 absorbs a light of a specific wavelength and emits a visible light of a predetermined wavelength according to a size of a core of the quantum dot 120.

Since the quantum dots 120 are attached to the surface of the inorganic oxide 110, a distance between the quantum dots 120 increases. In other words, by the inorganic oxide 110 having a size greater than that of the quantum dot 120, a distance between the quantum dots 120 increases. Accordingly, a forster resonance energy transfer (FRET) phenomenon, caused by that when forming a film with a plurality of quantum dots, a distance between the adjacent quantum dots is reduced, is prevented, and thus a quantum efficiency reduction can be solved.

<Synthesis of Inorganic Emitting Particle>

(1) Ligand Capping on $ZrO_2$ Particle $ZrO_2$ (100 mg) is put in a toluene solution of mercapto octanoic acid (100 mM) and stirred 80 degrees Celsius one day.

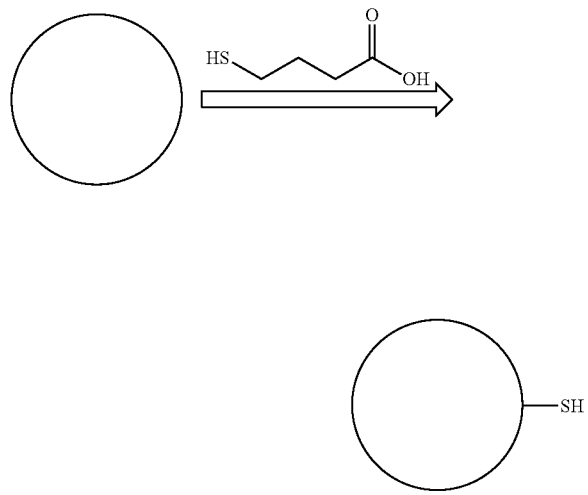

(2) Inorganic Emitting Particle

The above compound (1) and quantum dots (InP/ZnS, 1 g) are put in toluene (10 mL) and stirred, and then non-attached quantum dots are removed.

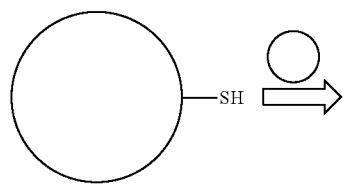

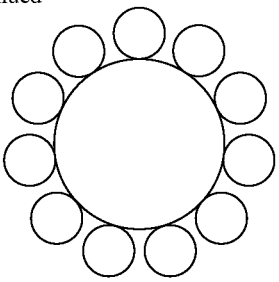

Accordingly, an inorganic emitting particle of InP/ZnS quantum dots attached (or combined) with an inorganic oxide 110 made of $ZrO_2$ is obtained.

Figure 3:
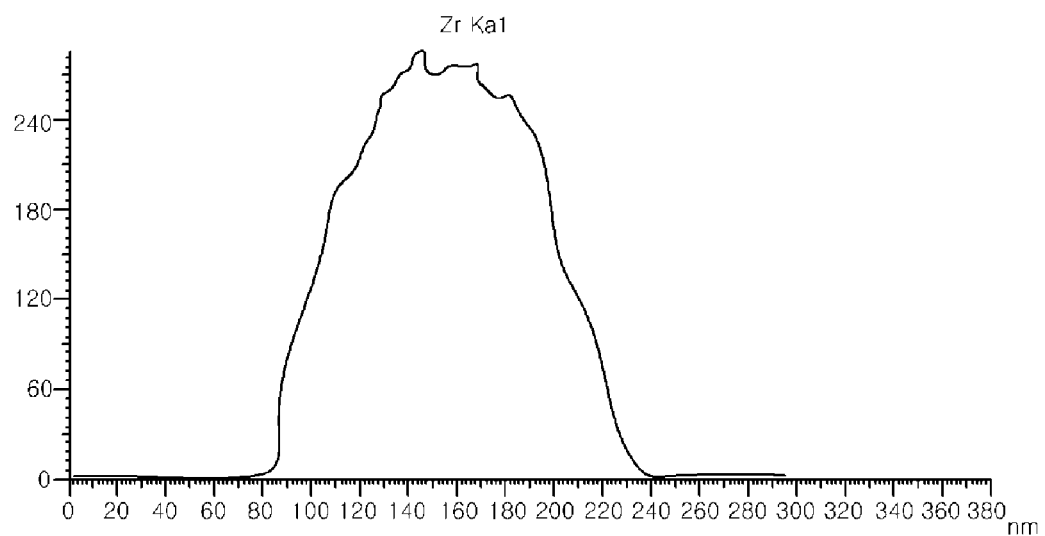
FIG. 3 is a view of an energy dispersive spectroscopy (EDS) spectrum showing an existence of $ZrO_2$ in an inorganic emitting particle.
Figure 4A:
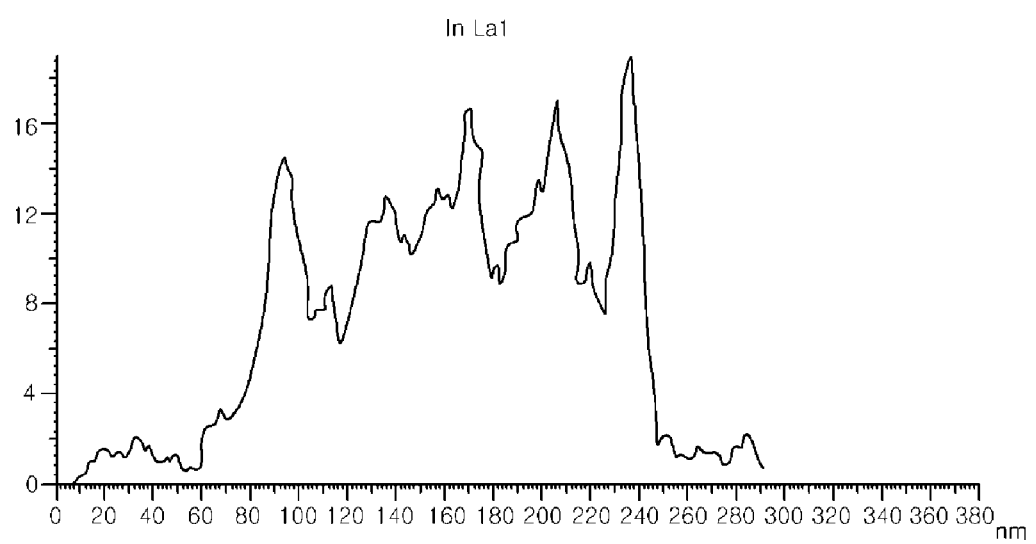
FIGS. 4A to 4D are each views of EDS spectrums showing an existence of an InP/ZnS quantum dot in an inorganic emitting particle.
Figure 4B:
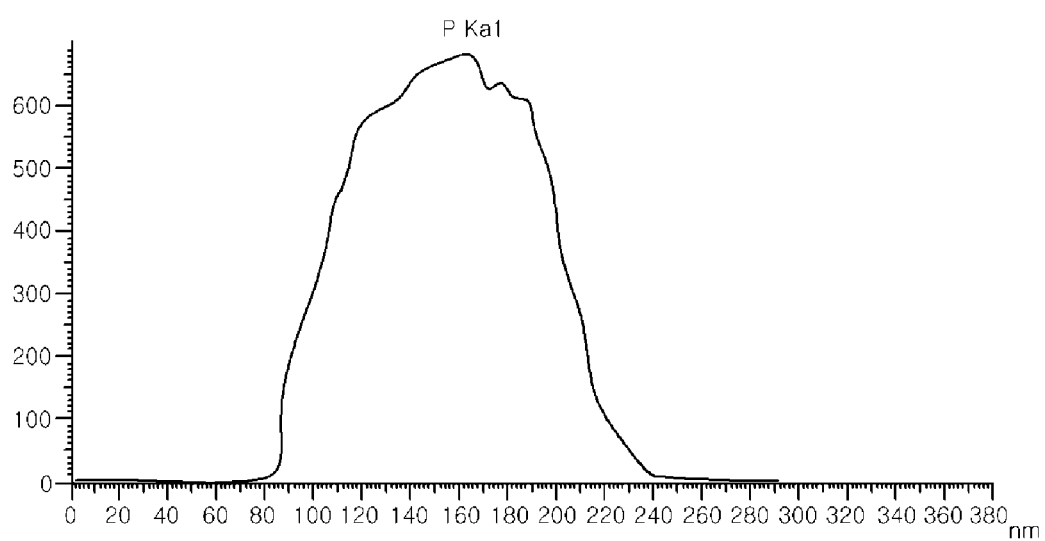
Figure 4C:
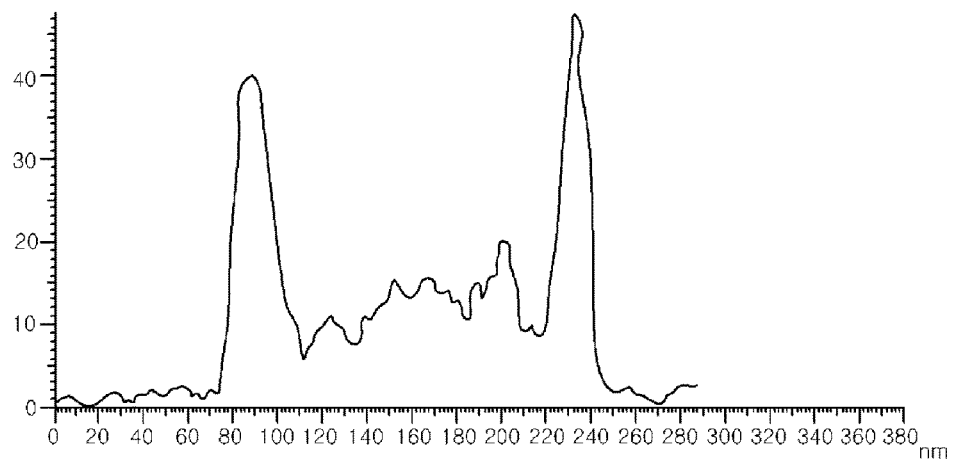
Figure 4D:
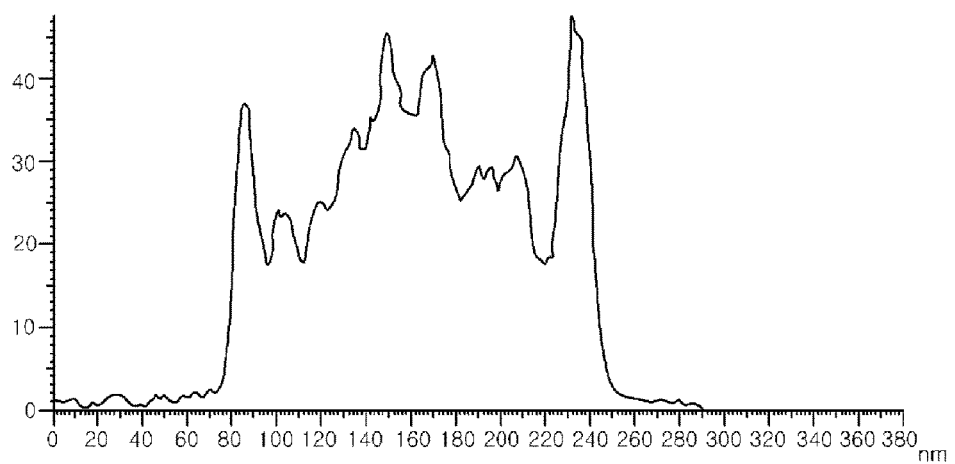

FIG. 3 is a view of an energy dispersive spectroscopy (EDS) spectrum showing an existence of $ZrO_2$ in an inorganic emitting particle, and FIGS. 4A to 4D are each views of EDS spectrums showing an existence of an InP/ZnS quantum dot in an inorganic emitting particle. In the drawings, an x axis indicates a distance from one side to the other side of an inorganic emitting particle, an y axis indicates a count per second.

In the EDS spectrum of FIG. 3, it is shown that a Zr atom forming the inorganic oxide 110 is detected. In the respective EDS spectrums of FIGS. 4A to 4D, it is shown that a In atom, a P atom, a Zn atom, and a S atom forming the quantum dot 120 are detected.

Figure 5:
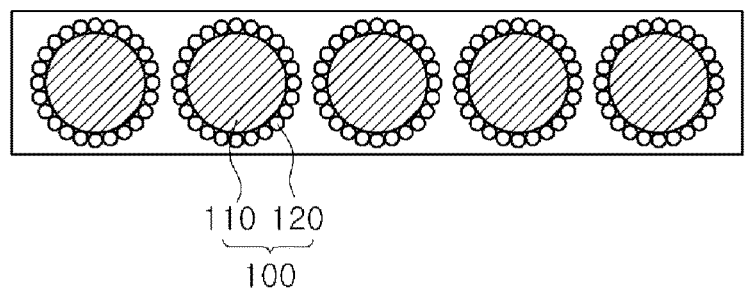
FIG. 5 is a schematic view illustrating an inorganic emitting particle film according to a second embodiment of the present invention.

FIG. 5 is a schematic view illustrating an inorganic emitting particle film according to a second embodiment of the present invention.

Referring to FIG. 5, an inorganic emitting particle film 200 of this embodiment has a layer formed by a plurality of inorganic emitting particles 100.

As described above, the inorganic emitting particle 100 includes the inorganic oxide 110 of a greater size, and the quantum dots 120 attached with the surface of the inorganic oxide 110, and the distance between the quantum dots 120 increases because of the inorganic oxide 110. Accordingly, the FRET phenomenon caused by a reduction of a distance between quantum dots can be minimized.

Figure 6:
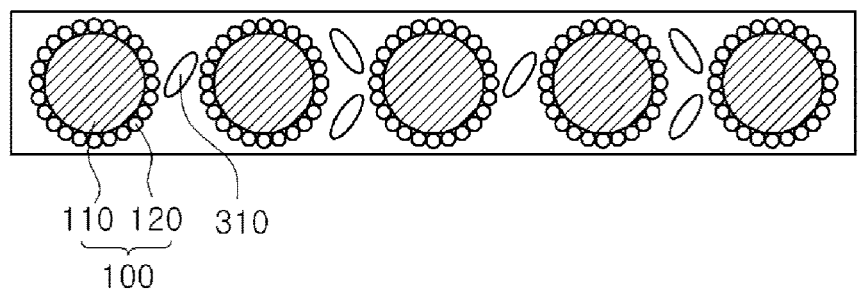
FIG. 6 is a schematic view illustrating an inorganic emitting particle film according to a third embodiment of the present invention.

FIG. 6 is a schematic view illustrating an inorganic emitting particle film according to a third embodiment of the present invention.

Referring to FIG. 6, an inorganic emitting particle film 300 of this embodiment includes inorganic emitting particles 100 and nano rods 310.

As described above, the inorganic emitting particle 100 includes the inorganic oxide 110 having a first size and a first energy band gap, and the quantum dot(s) 120 attached to the inorganic oxide 110 and having a second size less than the first size, and a second energy band gap less than the first energy band gap.

Each nano rod 310 is made of a semiconductor compound. The nano rod 310 has a third size (or a length on a major axis) that is less than the first size and greater than second size, and has a third energy band gap that is less than the first energy band gap and greater than the second energy band gap.

The nano rod 310 absorbs a light from a light source and transfers an energy to the quantum dot 120. Accordingly, an quantum efficiency of the quantum dot 120 and a brightness of the inorganic emitting particle film 300 increase.

In other words, the nano rod 310 is arranged between the adjacent inorganic emitting particles 100, a distance between the quantum dots 120 of the adjacent inorganic emitting particles 100 increases. That is, in one inorganic emitting particle 100, a distance between the quantum dots 120 increases by the inorganic oxide 110; and between the adjacent inorganic emitting particles 100, a distance between the quantum dots 120 increases by the nano rod 310. Thus, the FRET phenomenon between the quantum dots are further reduced and a quantum efficiency of the quantum dot 120 increases.

Further, since the nano rod 310 is greater in size than the quantum dot 120, the nano rod 310 sufficiently absorbs a light from a light source and transfers an energy to the quantum dot 120 having the less energy band gap. Thus, an quantum efficiency of the quantum dot 120 further increases. The nano rod 310 absorbs a light of a short wavelength (e.g., about 430 nm~470 nm).

In a case that the nano rod 310 has an energy band gap less than that of the quantum dot 120, an energy of the nano rod 310 is not transferred to the quantum dot 120, and in a case that the nano rod 310 has an energy band gap greater than that of the inorganic oxide 110, an energy of the nano rod 310 is transferred to the quantum rod 120 and the inorganic oxide 110 as well. In the present invention, the nano rod 310 has the third energy band gap less than the first energy band gap of the inorganic oxide 110 and greater than the second energy band gap of the quantum dot 120, and thus an light emission efficiency of the quantum dot 120 can be maximized.

The nano rod 310 has a rod shape with a first-direction length greater than a second-direction length. However, unlike a quantum rod having a core and a shell and emitting light, the nano rod 310 is made of a single material and does not serve a light emission. Accordingly, most of an light energy which the nano rods 310 absorb is transferred to the quantum dots 120 and is used of a light emission of the quantum dots 120.

For example, the nano rod may be made of one of ZnSe, SnSeS, ZnO, GaP, and GaN.

Figure 7:
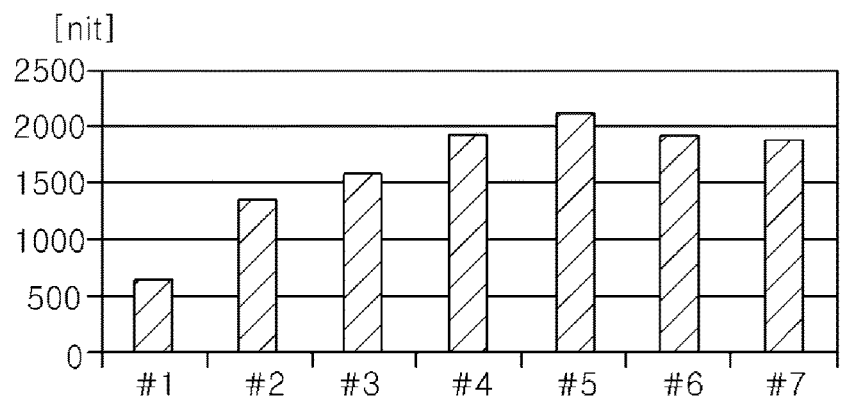
FIG. 7 is a graph illustrating brightnesses of an inorganic emitting particle films.

Brightnesses of a film (a comparative example, #1) formed by InP/ZnS quantum dots, a film (an experimental example 1, #2) formed by inorganic emitting particles with InP/ZnS quantum dots attached to a $ZrO_2$ inorganic oxide, and films (experimental examples 2-6, #3-#7) formed by inorganic emitting particles with InP/ZnS quantum dots attached to a $ZrO_2$ inorganic oxide, and ZnSe nano rods are measured and written in Table 1 and shown in FIG. 7.

The experimental examples 2-6 are films with 5 wt %, 10 wt %, 15 wt %, 30 wt %, and 60 wt %, respectively, of the nano rod with respect to the inorganic emitting particle.

TABLE 1

| | #1 | #2 | #3 | #4 | #5 | #6 | #7 |
|---|---|---|---|---|---|---|---|
| Brightness | 641 | 1358 | 1587 | 1927 | 2110 | 1915 | 1891 |

Referring to Table 1 and FIG. 7, the brightness of the inorganic emitting particle film of the experimental example 1 is greater than that of the comparative example. In other words, when the inorganic emitting particle film 200 includes the inorganic emitting particles 100 having the quantum dots 120 attached to the inorganic oxide 110, as described in the second embodiment, the inorganic emitting particle film 200 increases in brightness.

Further, the brightnesses of the inorganic emitting particle films of the experimental examples 2-6 are each greater than that of the comparative example. In other words, when the inorganic emitting particle film 300 includes the inorganic emitting particles 100 having the quantum dots 120 attached to the inorganic oxide 110, and the nano rods 310, as described in the third embodiment, the inorganic emitting particle film 300 further increases in brightness.

As the wt % of the nano rod 310 increases, the brightness of the inorganic emitting particle film 300 increases but is reduced over 15 wt %. Accordingly, the nano rod 310 may have 5 wt %~30 wt % with respect to the inorganic emitting particle. When a content of the nano rod 310 is very low (e.g., below 5 wt %), it is difficult to obtain an effect of brightness increase by the nano rod 310, and when a content of the nano rod 310 is very high (over 30 wt %), most of a light emitted from the quantum dot 120 is absorbed by the nano rod 310 and thus a brightness may be reduced.

Figure 8:
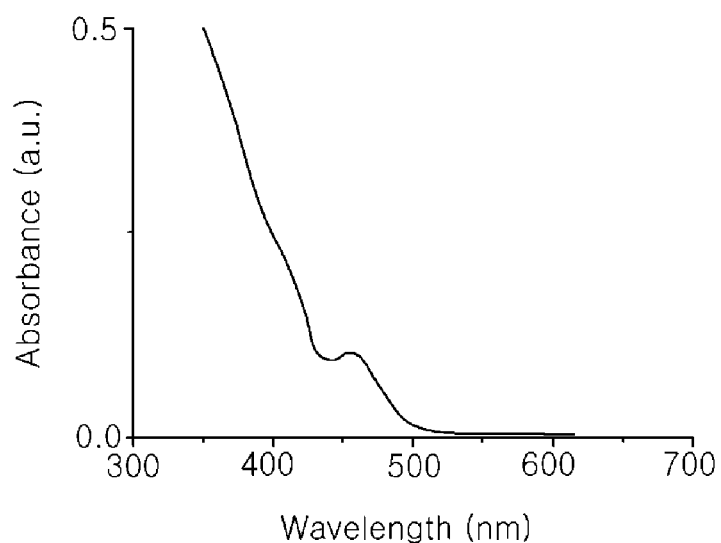
FIG. 8 is a graph illustrating an absorption spectrum of a ZnSe nano rod.
Figure 9:
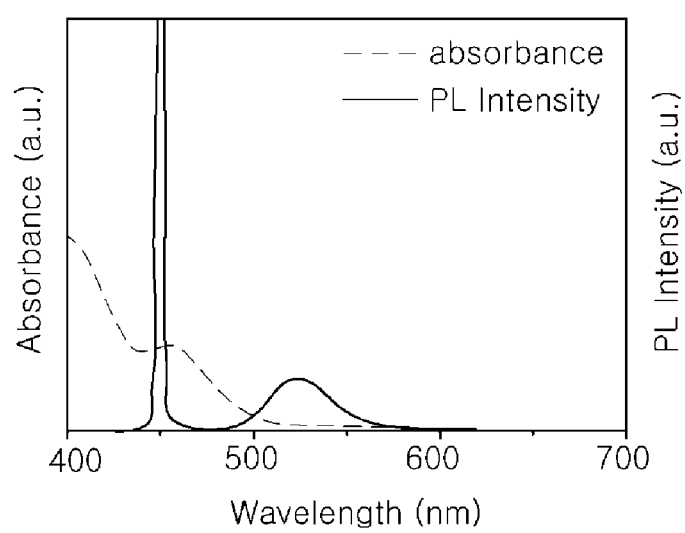
FIG. 9 is a graph illustrating an absorption spectrum of a ZnSe nano rod and a PL spectrum of an InP/ZnS quantum dot.

FIG. 8 is a graph illustrating an absorption spectrum of a ZnSe nano rod, and FIG. 9 is a graph illustrating an absorption spectrum of a ZnSe nano rod and a PL spectrum of an InP/ZnS quantum dot.

Referring to FIG. 8, a ZnSe nano rod absorbs a light of a wavelength of about 430 nm~470 nm. Further, referring to FIG. 9, an InP/ZnS quantum dot has a PL spectrum of about 520 nm~540 nm.

Figure 10:
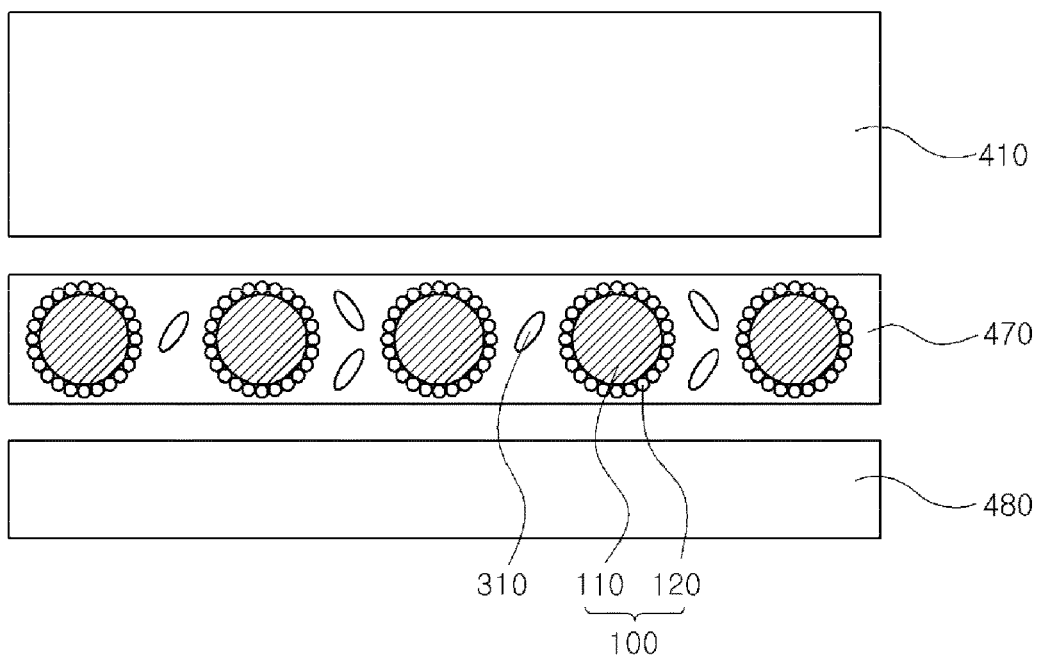
FIG. 10 is a schematic cross-sectional view illustrating an inorganic emitting particle film and a liquid crystal display device including the same according to a fourth embodiment of the present invention.
Figure 11:
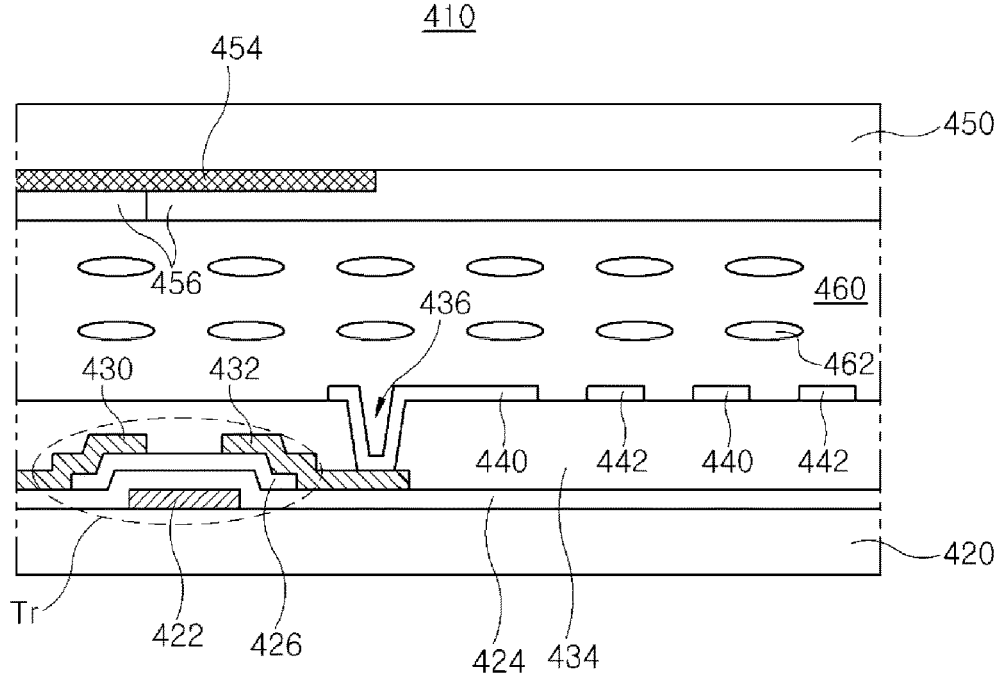
FIG. 11 is a schematic cross-sectional view illustrating a liquid crystal panel of FIG. 10.

FIG. 10 is a schematic cross-sectional view illustrating an inorganic emitting particle film and a liquid crystal display device including the same according to a fourth embodiment of the present invention, and FIG. 11 is a schematic cross-sectional view illustrating a liquid crystal panel of FIG. 10.

Referring to FIG. 10, a liquid crystal display device 400 as the display device of this embodiment includes a liquid crystal panel 410, a backlight unit 480 located below the liquid crystal panel 410, and an inorganic emitting particle film 470 located between the liquid crystal panel 410 and the backlight unit 480. All the components of the liquid crystal display device in all embodiments of the present invention are operatively coupled and configured.

Referring to FIG. 11, the liquid crystal panel 410 includes first and second substrates 420 and 450 facing each other, and a liquid crystal layer 460 interposed between the first and second substrates 420 and 450 and including liquid crystal molecules 462.

A gate electrode 422 is formed on the first substrate 420, and a gate insulating layer 424 is formed to cover the gate electrode 422. A gate line is formed on the substrate 420 and is connected to the gate electrode 422.

A semiconductor layer 426 is formed on the gate insulating layer 424 and corresponds to the gate electrode 422. The semiconductor layer 424 may be made of an oxide semiconductor material. Alternatively, the semiconductor layer 424 may include an active layer of an amorphous silicon, and an ohmic contact layer of an impurity-doped amorphous silicon.

Source and drain electrodes 430 and 432 are formed on the semiconductor layer 426 and are spaced apart from each other. A data line is formed to cross the gate line to define a pixel region, and is connected to the source electrode 430.

The gate electrode 422, the semiconductor layer 426, and the source and drain electrodes 430 and 432 forms a thin film transistor Tr.

A passivation layer 434 is formed on the thin film transistor Tr, and has a drain contact hole 436 exposing the drain electrode 432.

A pixel electrode 440 and a common electrode 442 are formed on the passivation layer 434. The pixel electrode 440 is connected to the drain electrode 432 through the drain contact hole 436, and the pixel electrode 440 and the common electrode 442 are alternately arranged.

A black matrix 454 is formed on the second substrate 450 and shields a non-display region where the thin film transistor Tr, the gate line, and the data line are formed. Further, a color filter layer 456 is formed corresponding to the pixel region.

The first and second substrates 420 and 450 are coupled to each other with the liquid crystal layer 460 therebetween. The liquid crystal molecules 456 are operated by an electric field produced between the pixel electrode 440 and the common electrode 442.

An alignment film may be formed at an inner surface of each of the first and second substrates 420 and 450 while contacting the liquid crystal layer 460. Polarizing plates may be attached on outer surfaces of the first and second substrates, respectively, and may have transmissive axes perpendicular to each other.

The backlight unit 480 includes a light source and supplies light to the liquid crystal panel 410.

The backlight unit 480 may be categorized into a direct type and an edge type according to a position of the light source.

When the backlight unit 480 is the direct type, this backlight unit may include a bottom frame covering the liquid crystal panel 410, and a plurality of light sources may be arranged on a horizontal surface of the bottom frame.

When the backlight unit 480 is the edge type, this backlight unit may include a bottom frame covering the liquid crystal panel 410, a light guide plate may be located on a horizontal surface of the bottom frame, and a light source may be arranged at at least one side of the light guide plate.

The light source emits a light of a short wavelength of about 430 nm~470 nm.

The inorganic emitting particle film 470 is located between the liquid crystal panel 410 and the backlight unit 480, and improves a color purity of a light supplied from the backlight unit 480.

The inorganic emitting particle film 470 includes the inorganic emitting particles 100 each including the inorganic oxide 110 and the quantum dots 120 attached to the inorganic oxide 110, and the nano rods 310. The quantum dot 120 emit a light of a green wavelength region or red wavelength region.

As described above, since a distance between the quantum dots 120 increases by the inorganic oxide 110, a quantum efficiency of the quantum dot 120 increases, and also, since a distance between the quantum dots 120 of the adjacent inorganic emitting particles 100 increases by the nano rod 310, a quantum efficiency of the quantum dot 120 further increases. Therefore, a brightness of the liquid crystal display device 400 including the inorganic emitting particle film 470 increases.

Alternatively, the inorganic emitting particle film 470 may include the inorganic emitting particles 100 without the nano rods 310.

Figure 12:
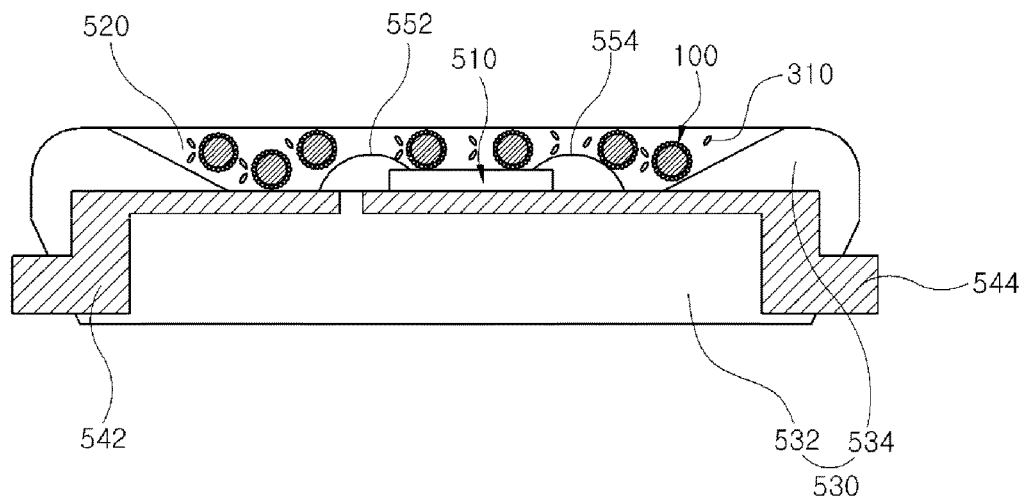
FIG. 12 is a schematic cross-sectional view illustrating an LED package according to a fifth embodiment of the present invention.

FIG. 12 is a schematic cross-sectional view illustrating an LED package according to a fifth embodiment of the present invention.

Referring to FIG. 12, an LED package 500 of this embodiment includes an LED chip 510 and an encapsulation part 520 covering the LED chip 510.

The encapsulation part 520 includes the inorganic emitting particles 100 including the inorganic oxide (e.g., 110 of FIG. 2) and the quantum dots (e.g., 120 of FIG. 2) attached to the inorganic oxide 110, and the nano rods 310. Alternatively, the encapsulation part 520 may include the inorganic emitting particles 100 without the nano rods 310.

The quantum dot 120 emits a light of a green wavelength region or red wavelength region. The LED chip 510 may a blue LED chip that emits a light of a wavelength of about 430 nm~470 nm.

The LED package 500 may further include a case 530, and first and second electrode leads 542 and 544 that are connected to the LED chip 510 through first and second wires 552 and 554, respectively, and are exposed out of a case 530.

The case 530 includes a body 532, and a side wall 534 that protrudes from a top surface of the body 532 and functions as a reflection surface. The LED chip 510 is located on the body 532 and is enclosed by the side wall 534.

As described above, since a distance between the quantum dots 120 increases by the inorganic oxide 110, a quantum efficiency of the quantum dot 120 increases, and also, since a distance between the quantum dots 120 of the adjacent inorganic emitting particles 100 increases by the nano rod 310, a quantum efficiency of the quantum dot 120 further increases. Therefore, a brightness of the LED package 500 including the inorganic emitting particle film 470 increases.

Figure 13:
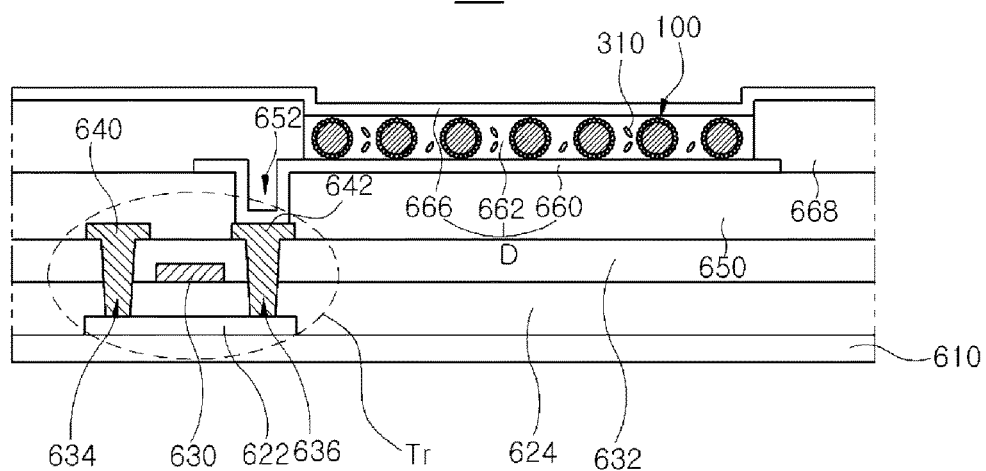
FIG. 13 is a schematic cross-sectional view illustrating a light emitting diode display device according to a sixth embodiment of the present invention.

FIG. 13 is a schematic cross-sectional view illustrating a light emitting diode display device according to a sixth embodiment of the present invention.

Referring to FIG. 13, a light emitting diode display device 600 of this embodiment includes a substrate 610, a driving element Tr on the substrate 610, and a light emitting diode D connected to the driving element Tr.

A semiconductor layer 622 is formed on the substrate 610 and is made of an oxide semiconductor material or polysilicon.

When the semiconductor layer 622 is made of an oxide semiconductor material, a light shielding pattern may be formed below the semiconductor layer 622, and the light shielding pattern functions to prevent a light from entering the semiconductor layer 622 and prevents the semiconductor layer 622 from being deteriorated by a light. Alternatively, when the semiconductor layer 622 is made of polysilicon, both sides of the semiconductor layer 622 may be doped with impurities.

A gate insulating layer 624 is formed on the semiconductor layer 622 and is made of an insulating material. The gate insulating layer 624 may be made of an inorganic insulating material, such as silicon oxide or silicon nitride.

A gate electrode 630 is formed on the gate insulating layer 624 corresponding to a center portion of the semiconductor layer 622, and is made of a conductive material such as metal.

An inter-layered insulating layer 632 is formed on the gate electrode 630 and is made of an insulating material. The inter-layered insulating layer 632 may be made of an inorganic insulating material such as silicon oxide or silicon nitride, or an organic insulating material such as benzocyclobutene or photo acryl.

The inter-layered insulating layer 632 has first and second contact holes 634 and 636 exposing both sides of the semiconductor layer 622. The first and second contact holes 634 and 636 are located at both sides of the gate electrode 630 and are spaced apart from the gate electrode 630.

Source and drain electrodes 640 and 642 are formed on the inter-layered insulating layer 632 and are made of a conductive material such as metal.

The source and drain electrodes 640 and 642 are spaced apart from each other with the gate electrode 630 therebetween, and contact the both sides of the semiconductor layer 622 through the first and second contact holes 634 and 636, respectively.

The semiconductor layer 622, the gate electrode 630, and the source and drain electrodes 640 and 642 form a thin film transistor Tr as the driving element Tr.

The thin film transistor Tr has a coplanar structure that the gate electrode 630 and the source and drain electrodes 640 and 642 are located on the semiconductor layer 622.

Alternatively, the thin film transistor Tr may have an inverted staggered structure that a gate electrode is located below a semiconductor layer, and source and drain electrodes are located on the semiconductor layer. In this case, the semiconductor layer may be made of amorphous silicon.

A gate line and a data line cross each other to define a pixel region, and a switching element connected to the gate and data lines is further formed. The switching element is connected to the thin film transistor Tr of the driving element.

Further, a power line may be formed parallel with, and is spaced apart from, the gate or data line, and a storage capacitor may be formed that functions to maintain a voltage of the gate electrode 630 of the thin film transistor Tr as the driving element during one frame.

A passivation layer 650 is formed to cover the thin film transistor Tr, and has a drain contact hole 652 exposing the drain electrode 642.

A first electrode 660 is formed separately at each pixel region and is connected to the drain electrode 642 of the thin film transistor Tr through the drain contact hole 652. The first electrode 660 may function as an anode, and may be made of a conductive material having a relatively high work function. For example, the first electrode 660 may be made of a transparent conductive material such as indium-tin-oxide (ITO) or indium-zinc-oxide (IZO).

When the light emitting diode display device 600 is a top emission type display device, a reflection electrode or reflection layer may be further formed below the first electrode 660. For example, the reflection electrode or reflection layer may be made of aluminum-palladium-copper (APC) alloy.

A bank layer 668 is formed on the passivation layer 650 and covers edges of the first electrode 660. The bank layer 668 corresponds to the pixel region and exposes a center portion of the first electrode 660.

An emitting layer 662 is formed on the first electrode 660, and includes the inorganic emitting particles 100 including the inorganic oxide (e.g., 110 of FIG. 2) and the quantum dots (e.g., 120 of FIG. 2) attached to the inorganic oxide 110, and the nano rods 310.

Alternatively, the emitting layer 662 may include the inorganic emitting particles 100 without the nano rods 310.

To raise a light emission efficiency, a hole injection layer and a hole transporting layer, which are sequentially stacked between the first electrode 660 and the emitting layer 662, and an electron transporting layer and an electron injection layer, which are sequentially stacked between the emitting layer 662 and a second electrode 666, may be further formed.

A second electrode 666 is formed on the substrate 610 having the emitting layer 662. The second electrode 666 may be located entirely over a display region, and may be made of a conductive material having a relatively low work function and function as a cathode. For example, the second electrode 666 may be made of one of aluminum (Al), magnesium (Mg), and aluminum-magnesium (AlMg) alloy.

The first electrode 660, the emitting layer 662 and the second electrode 666 form the light emitting diode D.

As described above, since a distance between the quantum dots 120 increases by the inorganic oxide 110, a quantum efficiency of the quantum dot 120 increases, and also, since a distance between the quantum dots 120 of the adjacent inorganic emitting particles 100 increases by the nano rod 310, a quantum efficiency of the quantum dot 120 further increases. Therefore, the light emitting diode display device 600 of this embodiment can display an image of a high brightness.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An inorganic emitting particle, comprising:
an inorganic oxide having a first size; and
quantum dots attached to the inorganic oxide and having a second size less than the first size,
wherein the inorganic oxide is silicon oxide having the first size of approximately 100 nm to approximately 300 nm, and
wherein the quantum dots form a layer covering an entire surface of the inorganic oxide.

2. The inorganic emitting particle of claim 1, wherein the inorganic oxide has an energy band gap greater than that of the quantum dots.

3. An inorganic emitting particle film comprising the inorganic emitting particle of claim 1.

4. The inorganic emitting particle film of claim 3, further comprising nano rods absorbing a light of a wavelength of approximately 430 nm to 470 nm.

5. The inorganic emitting particle film of claim 4, wherein at least one of the nano rods has an energy band gap that is less than that of the inorganic oxide and greater than that of the quantum dots.

6. The inorganic emitting particle film of claim 4, wherein at least one of the nano rods has approximately 5 wt % to 30 wt % with respect to the inorganic emitting particle.

7. A liquid crystal display device, comprising:
a liquid crystal panel;
a backlight unit below the liquid crystal panel and including a light source; and
an inorganic emitting particle film disposed between the liquid crystal panel and the backlight unit,
wherein the inorganic emitting particle film includes an inorganic oxide having a first size and quantum dots attached to the inorganic oxide and having a second size less than the first size, and
wherein the inorganic oxide is silicon oxide.

8. A light emitting diode (LED) package, comprising:
an LED chip; and
an encapsulation part including inorganic emitting particles and covering the LED chip,
wherein each of the inorganic emitting particles includes:
an organic oxide having a first size; and
quantum dots attached to the inorganic oxide and having a second size less than the first size.

9. The LED package of claim 8, wherein the encapsulation part further includes nano rods absorbing a light of a wavelength of approximately 430 nm to 470 nm.

10. The LED package of claim 9, wherein at least one of the nano rods has an energy band gap that is less than that of the inorganic oxide and greater than that of the quantum dots.

11. A liquid crystal display device, comprising:
a backlight unit including the LED package of claim 8; and
a liquid crystal panel on the backlight unit.

12. The liquid crystal display device of claim 11, wherein the encapsulation part further includes nano rods absorbing a light of a wavelength of approximately 430 nm to 470 nm.

13. The liquid crystal display device of claim 12, wherein at least one of the nano rods has an energy band gap that is less than that of the inorganic oxide and greater than that of the quantum dots.

14. A light emitting diode display device, comprising:
a substrate;
a light emitting diode that includes first and second electrodes facing each other, and an emitting layer including inorganic emitting particles and located between the first and second electrodes; and
a driving element between the substrate and the light emitting diode and connected to the light emitting diode,
wherein each of the inorganic emitting particles includes:
an inorganic oxide having a first size; and
quantum dots attached to the inorganic oxide and having a second size less than the first size.

15. The light emitting diode display device of claim 14, wherein the emitting layer further includes nano rods absorbing a light of a wavelength of approximately 430 nm to 470 nm.

16. The light emitting diode display device of claim 15, wherein at least one of the nano rods has an energy band gap that is less than that of the inorganic oxide and greater than that of the quantum dots.

17. The liquid crystal display device of claim 7, further comprising nano rods absorbing a light of a wavelength of approximately 430 nm to 470 nm.

18. The liquid crystal display device of claim 17, wherein at least one of the nano rods has an energy band gap that is less than that of the inorganic oxide and greater than that of the quantum dots.

19. The liquid crystal display device of claim 17, wherein at least one of the nano rods has approximately 5 wt % to 30 wt % with respect to the inorganic emitting particle.

20. The LED package of claim 9, wherein at least one of the nano rods has approximately 5 wt % to 30 wt % with respect to the inorganic emitting particle.

21. The liquid crystal display device of claim 12, wherein at least one of the nano rods has approximately 5 wt % to 30 wt % with respect to the inorganic emitting particle.

22. The light emitting diode display device of claim 15, wherein at least one of the nano rods has approximately 5 wt % to 30 wt % with respect to the inorganic emitting particle.

23. An inorganic emitting particle film, comprising;
an inorganic oxide having a first size;
quantum dots attached to the inorganic oxide and having a second size less than the first size; and
nano rods absorbing a light of a wavelength of approximately 430 nm to 470 nm,
wherein the inorganic oxide is silicon oxide.

* * * * *